United States Patent
Brueggen

(10) Patent No.: US 10,050,641 B1
(45) Date of Patent: Aug. 14, 2018

(54) LIST MANIPULATION CIRCUITS

(71) Applicant: HEWLETT PACKARD ENTERPRISE DEVELOPMENT LP, Houston, TX (US)

(72) Inventor: Chris Michael Brueggen, Plano, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/467,750

(22) Filed: Mar. 23, 2017

(51) Int. Cl.
  *H03M 7/46* (2006.01)
  *G06F 17/16* (2006.01)

(52) U.S. Cl.
  CPC .............. *H03M 7/46* (2013.01); *G06F 17/16* (2013.01)

(58) Field of Classification Search
  CPC .................................. H03M 7/46; G06F 17/16
  See application file for complete search history.

(56) References Cited

U.S. PATENT DOCUMENTS

| 5,717,616 A | 2/1998 | Morris |
| 6,754,685 B2 | 6/2004 | Becker |
| 9,513,907 B2 | 12/2016 | Ould-Ahmed-Vall |
| 2009/0019100 A1 | 1/2009 | Moyer et al. |

OTHER PUBLICATIONS

Chen L. et al., "Static Analysis of List-Manipulating Programs via Bit-Vectors and Numerical Abstractions," (Research Paper), Mar. 18-22, 2013, 7 pages.
cray.com, "CPU Introduction," (Web Page), 31 pages, available at ftp://ftp.cray.com/product-info/YMPEL/Sec2.html.
Parhami B., "Associative Memory Designs for VLSI Implementation," (Research Paper), Feb. 24, 1998, pp. 359-366.

*Primary Examiner* — Matthew Sandifer
(74) *Attorney, Agent, or Firm* — Hewlett Packard Enterprise Patent Department

(57) ABSTRACT

Examples disclosed herein relate to very large-scale integration (VLSI) list manipulation circuits. In accordance with some examples disclosed herein, a list manipulation circuit may include a progressive population count circuit to generate population count values. The population count values may be fed into various types of circuits, such as list conversion circuits, list compactor circuits, and list reordering circuits.

17 Claims, 9 Drawing Sheets

LIST MANIPULATION CIRCUITS

BACKGROUND

Very large scale integration (VLSI) devices often contain functions for complex computational tasks such as error-correction code (ECC) decoding, encryption, data compression, or various types of data analysis.

A complex computational task may be broken down into many simple computational tasks. Some of those simple computational tasks may be common or frequently occurring. For good performance and efficiency, it may be desirable to identify standard and generally optimal solutions for common computational tasks.

BRIEF DESCRIPTION OF THE DRAWINGS

The following detailed description references the drawings, wherein.

DETAILED DESCRIPTION

Figure 1:
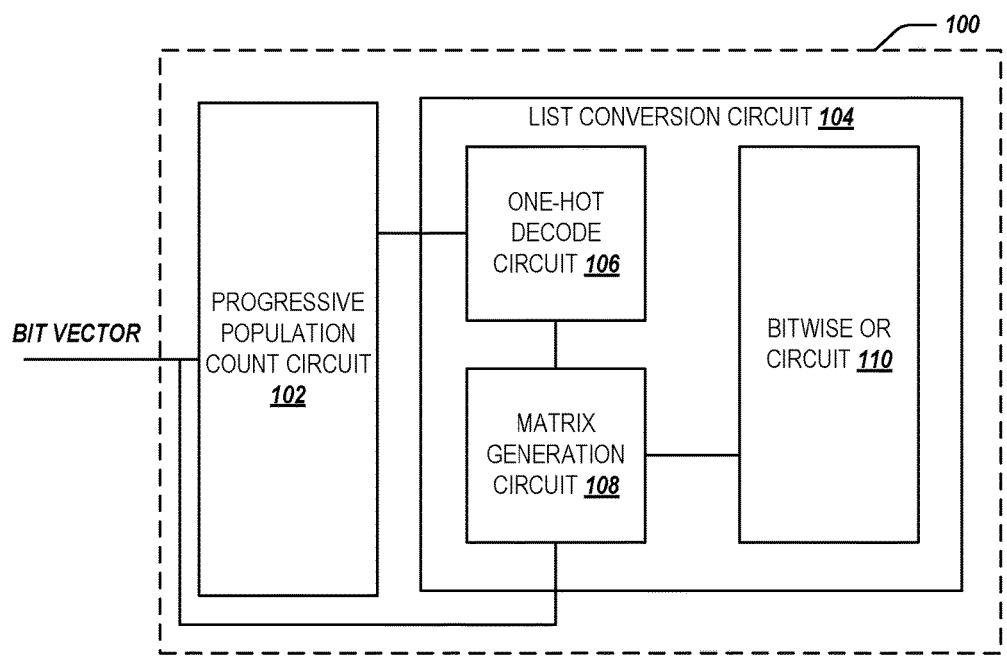
FIG. 1 is a block diagram of an example list manipulation circuit.

Some common tasks involve the manipulation of simple lists of binary values. As used herein in the context of binary value lists, the term "simple" may refer to both the size and the contents of a list. In some implementations, the list size may be assumed to be on the order of dozens, and the list may include some number of N-bit (e.g. N=8) binary values. The list values may be elements of a finite field $GF(2^N)$ or unsigned integers in the range 0 to $2^N-1$. In some implementations, there may be other simplifying assumptions as well, such as a guarantee that a particular value will appear in the list no more than x times. For example, in an ECC decoder implementation, the system may be designed such that there may be a guarantee that each value in a list may correspond to a unique error location. As another example, in a data compression or data analysis implementation, the system may be designed such that there may be a list of indices in the data being analyzed which have some commonality, such as each index in the list being a fixed size of bits.

In some implementations, a list may be converted from one hardware state representation to another or may be processed in various ways. Doing so, however, may take an undesirably large number of logic levels, hardware registers, and hardware clock cycles. For example, converting a sparse $2^N$-bit vector to a compact list of values may be accomplished with a sequence of priority encoding and masking steps, where each step takes a clock cycle in the hardware to execute. As another example, a list compaction operation may be accomplished with a sequence of compare and multiplex steps. In each step, the lowest numbered invalid list entry may be found, and all list entries higher than that may be shifted down. Beyond a certain list size, or a certain number of potentially invalid entries, this may take an undesirably large number of logic levels or iterations. As a further example, reordering a list of binary values may involve a sequence of compare and multiplex steps, where each step includes comparing pairs of values, and possibly swapping pairs of values, in order to move the lower of the two values toward the low end of the list. Again, beyond a certain list size, this may take an undesirably large number of logic levels or iterations.

Examples disclosed herein provide VLSI list manipulation circuits that include scalable logic structures, which may be reused in a variety of list manipulation scenarios. The example list manipulation circuits may receive a bit vector as an input and perform a progressive population count for the bit vector. The progressive population count may provide count values for entries in the bit vector, which may represent the number of occurrences of '1' values in bit vector prior to the corresponding entry. The population counts may be used in various list manipulation scenarios, such as converting a bit vector representation to a compact list of explicit values, identifying the lowest N list values in a bit vector representation for possible removal, compacting a list of explicit binary values so that no valid entries are separated by invalid entries, and reordering a list of explicit values.

Reference is now made to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the present disclosure does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

FIG. 1 is a block diagram of an example list manipulation circuit 100. List manipulation circuit 100 may be used to convert bit vectors to compact lists of explicit values. In an example implementation of ECC codeword decoding, list manipulation circuit 100 may convert a bit vector representation of error locations in an ECC codeword to an ordered list of explicit error locations.

As shown in FIG. 1, list manipulation circuit 100 may include various circuits and circuit components, such as a progressive population count circuit 102 and a list conversion circuit 104. List conversion circuit 104 may include a one-hot decode circuit 106, a matrix generation circuit 108, and a bitwise OR circuit 110. Other arrangements and numbers of components may be utilized without departing from the examples of the present disclosure. List manipulation circuit 100 may be implemented in an electronic hardware device such as, for example, an application-specific integrated circuit (ASIC) device, a system-on-chip (SoC), or a field-programmable gate array (FPGA). Progressive population count circuit 102, list conversion circuit 104, one-hot decode circuit 106, matrix generation circuit 108, and bitwise OR circuit 110 may be electronic and/or digital logic circuits implemented by the hardware device and may be defined in a hardware description language (HDL) such as VHDL or Verilog.

Progressive population count circuit 102 may receive a bit vector made up of a string of 1 values and 0 values. The maximum quantity of possible 1 values may be set according to the capabilities of the system in which list manipulation circuit 100 is included. For example, where list manipulation circuit 100 is included in an ECC system, the maximum quantity of possible 1 values may be equal to the maximum possible error locations in an ECC codeword. As an example, an 80-symbol ECC codeword may have up to 16 possible error locations that may be represented by 1 values in a bit vector.

Progressive population count circuit 102 may generate a plurality of population count values for the received bit vector. Each one of the generated population count values may correspond to an entry (i.e., to one bit) in a bit vector. The population count value for the bit vector entry may be the total count of entries set to a 1 value in the bit vector prior to the entry. For example, the population count for the fourth entry in the bit vector 000011010 may be 2 because the total count of 1 values in entries 0-3 (counting from the right) is 2. The population count values may be represented as k-bit binary values (e.g., a population count of 2 may be represented as a 4-bit binary value 0010).

Progressive population circuit 102 may provide the population count values to one-hot decode circuit 106 of list conversion circuit 104. One-hot decode circuit 106 may produce a one-hot representation for each received population count value. One-hot decode circuit 106 may produce one-hot representations of the population count values by converting the k-bit binary values to j-bit (e.g., 16 bit) vectors. The one-hot representations may have one bit with a value of 1 in a position corresponding to the population count value and remaining bits in the one-hot representations may be a value of 0. As an example of the above, one-hot decode circuit 106 may produce a one-hot representation for a population count of 2 by converting its 4-bit binary value 0010 to 0010000000000000. Each possible population count value may be assigned its own unique one-hot representation. For example, a population count value of 0000 may be assigned a one-hot representation of 1000000000000000, a population count value of 0001 may be assigned a one-hot representation of 0100000000000000, a population count value of 0010 may be assigned a one-hot representation of 0010000000000000, and so on.

One-hot decode circuit 106 may provide the one-hot representations to matrix generation circuit 108. Matrix generation circuit 108 may also receive the bit vector. With the bit vector and one-hot representations, matrix generation circuit 108 may generate a value matrix. Each row of the value matrix may correspond to one of the entries in the bit vector. The total quantity of rows in the value matrix may be equal to the quantity of entries in the bit vector (e.g., 80 rows, 0-79, for an 80-bit bit vector). The total quantity of columns in value matrix may be equal to the maximum quantity of possible 1 values in the bit vector (e.g., 16 columns, 0-15).

For each row in the value matrix, matrix generation circuit 108 may determine whether the corresponding bit vector entry is a 1 value or 0 value. If the corresponding bit vector entry is determined to be a 0 value, matrix generation circuit 108 may set all of the column positions in the row to binary values of 0. If the corresponding bit vector entry is determined to be a 1 value, matrix generation circuit 108 may set one of the column positions in the row to a binary value representing the bit vector entry number of the entry, and may set the remaining column positions in the row to binary values of 0. For example, if the 64th bit vector entry in a bit vector is set to a 1 value, matrix generation circuit 108 may set one of the column positions in the row corresponding to that entry to a binary value representing the number 64, and may set the remaining column positions in the row to binary values of 0.

The column position that is set to the bit vector entry number of the entry may be determined based on the entry's corresponding one-hot representation. For example, the bit vector entry number of the entry may be placed in the column position equal to the location of the 1 value in the entry's corresponding one-hot representation. Accordingly, and as an example, if entry number 35 in a bit vector is set to a 1 value, and it has a one-hot representation of 0001000000000000 (i.e., a population count value of 3), matrix generation circuit 108 may set the fourth column position on the left side of the value matrix (i.e., column position 3) in the row corresponding to entry number 35 to a binary value representing the number 35 because the position 3 in the one-hot representation is set to a 1 value.

In some implementations, matrix generation circuit 108 may also generate a valid matrix from the bit vector and one-hot representations. Matrix generation circuit 108 may construct the valid matrix in similar fashion to the value matrix, except that a 1 value may be placed in a column position for entries that are set to a 1 value instead of their bit vector entry numbers. The valid matrix may be used to construct a list of valid bits that indicate which bit vector entry numbers in the ordered list of bit vector entry numbers are valid.

Bitwise OR circuit 110 may bitwise OR the rows of value matrices to generate ordered lists of bit vector entry numbers. The bitwise OR operation may OR all of the values in a given column position for every row in the value matrix. Similarly, bitwise OR circuit 110 may bitwise OR the rows of valid matrices to generate a list of valid bits.

The following illustrates an example of an implementation of list manipulation circuit 100 decoding an 80-symbol ECC codeword having a code distance that allows for the correction of up 16 symbol errors. At a certain point in the decode process, up to 16 error locations represented as 1 values in an 80-bit bit vector may be identified:

bit_vec[79:0]=01000000_00001000_

10010000_10010100_

00001000_10000000_

00100000_00001100_

00000000_01000100      (1)

To convert the bit vector to a compact list of up to 16 explicit values, each value corresponding to a bit vector entry that is a 1 value, progressive population count circuit 102 may perform a progressive population count on the bit vector. The output from the progressive population count may be a vector of 80 (4-bit) population count values. Each population count value may correspond to an entry of the bit vector and gives the count of 1 values in the bit vector up to (but not including) that entry:

Prog. pop. count={

0,0,0,1,1,1,1,2,2,2,2,2,2,2,2,2,//<-bit_vec[0 . . . 15]

2,2,2,3,4,4,4,4,4,4,4,4,4,4,5,5,//<-bit_vec[16 . . . 31]

5,5,5,5,5,5,5,6,6,6,6,7,7,7,7,7,//<-bit_vec[32 . . . 47]

7,7,7,8,8,9,9,9,10,10,10,10,10,11,11,11,//<-bit_vec[48 . . . 63]

12,12,12,12,13,13,13,13,13,13,13,13,13,13,13,14}//<-bit_vec[64 . . . 79]         (2)

One-hot decode circuit 106 may generate one-hot representations for each population count values.

Figure 2:
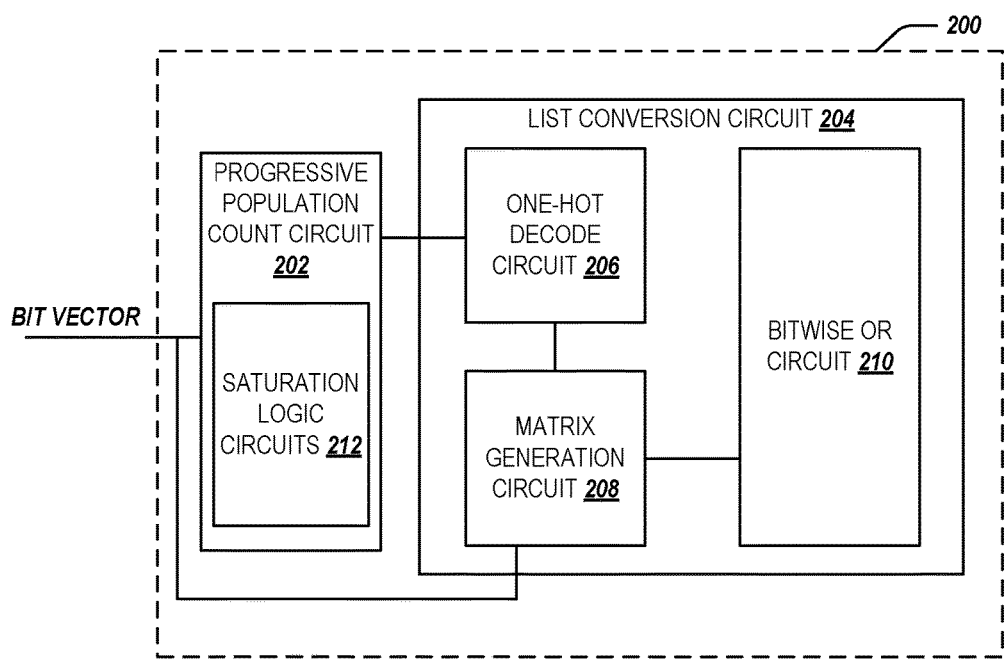
FIG. 2 is a block diagram of an example list manipulation circuit.

Next, matrix generation circuit 108 may construct a value matrix and a valid matrix from the bit vector and one-hot representations. Matrix generation circuit 108 finds a 1 value in bit vector entry 2. The corresponding one-hot representation has a 1 value in the 0 position, so matrix generation circuit 108 places a 2 in column position 0 of row 2 of the value matrix and 1 value column position 0 of row 2 of the valid matrix. Matrix generation circuit 108 finds a 1 value in bit vector entry 6. The corresponding one-hot representation has a 1 value in position 1, so matrix generation circuit 108 places a 6 in column position 1 of row 6 of the value matrix and a 1 value in column position 1 of row 6 of the valid matrix. Matrix generation circuit 108 continues similarly with the remaining entries in the bit vector until the value matrix and valid matrix are complete:

FIG. 2 is a block diagram of an example list manipulation circuit 200. List manipulation circuit 200 may be implemented by hardware similar to list manipulation circuit 100 and may include electrical and/or logic circuits similar to those included in list manipulation circuit 100, such as a progressive population count circuit 202 and a list conversion circuit 204 that includes a one-hot decode circuit 206, a matrix generation circuit 208, and a bitwise OR circuit 210. Progressive population count circuit 202 may also include saturation logic circuits 212. Other arrangements and numbers of components may be utilized without departing from the examples of the present disclosure.

List manipulation circuit 200 may be used to identify the lowest n (e.g., 4) values in a list. In an example implementation, the list of values may be unassigned transaction identifiers in a pool of d (e.g., 64) transaction identifiers 0 to d−1. List manipulation circuit 200 may track the pool of d transaction identifiers as a bit vector (e.g., a 64-bit vector).

The transaction identifiers may be used, for example, in transactions on a fabric. For example, a hardware component may issue transactions into the fabric. Each transaction may include a request and a response. Each request may be issued with a unique transaction identifier, and the corresponding response may have the same transaction identifier. Up to n sub-components within the hardware component may issue transactions on the fabric in parallel. Accordingly, list manipulation circuit 200 may identify the lowest n transaction identifiers in the pool of d transaction identifiers to assign to the issued transactions.

Each entry number in the bit vector tracked by list manipulation circuit 200 may correspond to a transaction identifier (e.g., entry number 23 corresponds to transaction identifier 23), and the value of each entry number may represent whether the corresponding transaction identifier is available. A 1 value may indicate that a transaction identifier is available and a 0 value may indicate that a transaction identifier is not available, or vice versa.

(3)

|     |    | column | | | | | | | | | | | | | | | | column | | | | | | | | | | | | | | | |
| --- | -- | -- | -- | -- | -- | -- | -- | -- | -- | -- | -- | -- | -- | -- | -- | -- | -- | -- | -- | -- | -- | -- | -- | -- | -- | -- | -- | -- | -- | -- | -- | -- |
|     |    | 0 | 1 | 2 | 3 | 4 | 5 | 6 | 7 | 8 | 9 | 10 | 11 | 12 | 13 | 14 | 15 | 0 | 1 | 2 | 3 | 4 | 5 | 6 | 7 | 8 | 9 | 10 | 11 | 12 | 13 | 14 | 15 |
| row | 0  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|     | 1  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|     | 2  | 2 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |
|     | 3  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|     | 4  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|     | 5  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|     | 6  | 0 | 6 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 |
|     | 7  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|     | .  | | | | | | | | | | | | | | | | | | | | | | | | | | | | | | | | |
|     | 18 | 0 | 0 | 18 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 |
|     | 19 | 0 | 0 | 0 | 19 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 |
|     | 20 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|     | .  | | | | | | | | | | | | | | | | | | | | | | | | | | | | | | | | |
|     | 78 | 0 | 0 | 0 | 0 | 0 | 0 | 0 | 0 | 0 | 0 | 0 | 0 | 0 | 78 | 0 | 0 | 0 | 0 | 0 | 0 | 0 | 0 | 0 | 0 | 0 | 0 | 0 | 0 | 0 | 1 | 0 | 0 |
|     | 79 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|     |    | 2 | 6 | 18 | 19 | 29 | 39 | 43 | 58 | 52 | 55 | 60 | 63 | 67 | 78 | 0 | 0 | 1 | 1 | 1 | 1 | 1 | 1 | 1 | 1 | 1 | 1 | 1 | 1 | 1 | 1 | 0 | 0 |

Bitwise OR circuit 110 may bitwise OR the rows of the value matrix and valid matrix to construct the following 16-entry list having 14 valid entries:

{2,6,18,19,29,39,43,50,52,55,60,63,67,78,--,--}         (4)

Progressive population count circuit 202 may receive the bit vector and generate population count values for the entries in the bit vector. The population count values may be k-bit binary values. Saturation logic circuits 212 included in progressive population count circuit 202 may saturate the progressive population count for count values ≥n. For example, saturation logic circuits 212 may set population count values ≥n to n. Thus, if n is set to 4, saturation logic circuit 212 may set population count values of 4 and above to a value of 4. Progressive population count circuit 202 may provide the population count values to one-hot decoder circuit 206 of list conversion circuit 204.

One-hot decode circuit 206 may produce a one-hot representation for each received population count value and may provide the one-hot representations to matrix generation circuit 208. Matrix generation circuit 208 may also receive the bit vector representation of the list of values. With the bit vector and one-hot representations, matrix generation circuit 208 may generate a value matrix. Each row of the value matrix may correspond to one of the entries in the bit vector. The total quantity of rows in the value matrix may be equal to the quantity of entries in the bit vector (e.g., 64 rows, 0-63, for a 64-bit bit vector). The total quantity of columns in value matrix may be equal to n (e.g., 4 columns, 0-3).

For each row in the value matrix, matrix generation circuit 208 may determine whether the corresponding bit vector entry is a 1 value or 0 value. If the corresponding bit vector entry is determined to be a 0 value, matrix generation circuit 208 may set all of the column positions in the row to binary values of 0. If the corresponding bit vector entry is determined to be a 1 value, and the one-hot representation is determined to be <n, matrix generation circuit 208 may set one of the column positions in the row to a binary value representing the bit vector entry number of the entry, and may set the remaining column positions in the row to binary values of 0. For example, if the 64th bit vector entry in a bit vector is set to a 1 value, and the one-hot representation for the 64th bit vector entry is 2, matrix generation circuit 208 may set column position 2 in the row corresponding to that entry to a binary value representing the number 64, and may set the remaining column positions in the row to binary values of 0. If the corresponding bit vector entry is determined to be a 1 value, but the one-hot representation is determined to be n, matrix generation circuit 208 may set all of the column positions in the row to binary values of 0. Thus, only the lowest n bit vector entries (e.g., entries 0-3 for n=4) with a value of 1 will show up in the value matrix.

In some implementations, matrix generation circuit 208 may also generate a valid matrix from the bit vector and one-hot representations. Matrix generation circuit 208 may construct the valid matrix in similar fashion to the value matrix, except that a 1 value may be placed in a column position for entries that are set to a 1 value and have one-hot representations <n, instead of their bit vector entry numbers. The valid matrix may be used to construct a list of valid bits that indicate which entries in the final list of n values are valid.

Bitwise OR circuit 210 may bitwise OR the rows of the value matrix to generate a list of the lowest n bit vector entry numbers with a value of 1. The bitwise OR operation may OR all of the values in a given column position for every row in the value matrix. Similarly, bitwise OR circuit 210 may bitwise OR the rows of valid matrices to generate a list of valid bits.

The following illustrates an example of an implementation of list manipulation circuit 200 tracking 64 transaction identifiers used by a hardware component to issue transactions into a fabric. List manipulation circuit 200 may start with a list of unused transaction identifiers and may identify a subset (e.g., lowest four) of transaction identifiers for use in parallel:

{3,11,17,24,26,30,31,32,33,34, 37,38,39,44,45,46,47,48,49,51, 52,53,55,56,58,59,60,61,62,63}  (5)

List manipulation circuit 200 may track the transaction identifiers as a 64-bit vector. A 1 value in a vector entry may indicate that the corresponding transaction identifier is unused:

bit_vec[63:0]=11111101_10111011

11110000_11100111_

11000101_00000010_

00001000_00001000  (6)

To create a list of the entry numbers of the lowest four entries containing 1 values, progressive population count circuit 202 may perform a progressive population count on the bit vector. The output from the progressive population count may be a vector of 64 (3-bit) population count values. Each population count value may correspond to an entry of the bit vector and gives the count of 1 values in the bit vector up to (but not including) that entry, except that saturation logic circuits 212 may saturate count values above a threshold (e.g., 3) to a saturation value (e.g., 4):

Prog. pop. count={

0,0,0,0,1,1,1,1,1,1,1,1,2,2,2,2,11<-bit_vec[0 . . . 15]

2,2,3,3,3,3,3,3,4,4,4,4,4,4,4,4,//<-bit_vec[16 . . . 31]

4,4,4,4,4,4,4,4,4,4,4,4,4,4,4,4,//<-bit_vec[32 . . . 47]

4,4,4,4,4,4,4,4,4,4,4,4,4,4,4,4}//<-bit_vec[48 . . . 63]  (7)

One-hot decode circuit 206 may generate one-hot representations for each population count values.

Next, matrix generation circuit 208 may construct a value matrix and a valid matrix from the bit vector and one-hot representations. Matrix generation circuit 208 finds a 1 value in bit vector entry 3. The corresponding one-hot representation has a 1 value in the 0 position, so matrix generation circuit 208 places a 3 in column position 0 of row 3 of the value matrix and 1 value column position 0 of row 3 of the valid matrix. Matrix generation circuit 208 finds a 1 value in bit vector entry 11. The corresponding one-hot representation has a 1 value in position 1, so matrix generation circuit 208 places an 11 in column position 1 of row 11 of the value matrix and a 1 value in column position 1 of row 11 of the valid matrix. Matrix generation circuit 208 finds a 1 value in bit vector entry 17. The corresponding one-hot representation has a 1 value in position 2, so matrix generation circuit 208 places a 17 in column position 2 of row 17 of the value matrix and a 1 value in column position 2 of row 17 of the valid matrix. Matrix generation circuit 208 finds a 1 value in bit vector entry 24. The corresponding one-hot representation has a 1 value in position 3, so matrix generation circuit 208 places an 24 in column position 3 of row 24 of the value matrix and a 1 value in column position 3 of row 24 of the valid matrix. The remainder of the bit vector is ignored because the population count values for the remaining entries exceed the threshold value of 3:

(8)

| | | column | | | | column | | | |
|---|---|---|---|---|---|---|---|---|---|
| | | 0 | 1 | 2 | 3 | 0 | 1 | 2 | 3 |
| row | 0 | 0 | 0 | 0 | 0 | 0 | 0 | 0 | 0 |
| | 1 | 0 | 0 | 0 | 0 | 0 | 0 | 0 | 0 |
| | 2 | 0 | 0 | 0 | 0 | 1 | 0 | 0 | 0 |
| | 3 | 3 | 0 | 0 | 0 | 0 | 0 | 0 | 0 |
| | 4 | 0 | 0 | 0 | 0 | 0 | 0 | 0 | 0 |
| | . | | | | | | | | |
| | 10 | 0 | 0 | 0 | 0 | 0 | 0 | 0 | 0 |
| | 11 | 0 | 11 | 0 | 0 | 0 | 1 | 0 | 0 |
| | 12 | 0 | 0 | 0 | 0 | 0 | 0 | 0 | 0 |
| | . | | | | | | | | |
| | 17 | 0 | 0 | 17 | 0 | 0 | 0 | 1 | 0 |
| | 18 | 0 | 0 | 0 | 0 | 0 | 0 | 0 | 0 |
| | . | | | | | | | | |
| | 23 | 0 | 0 | 0 | 0 | 0 | 0 | 0 | 0 |
| | 24 | 0 | 0 | 0 | 24 | 0 | 0 | 0 | 1 |
| | 25 | 0 | 0 | 0 | 0 | 0 | 0 | 0 | 0 |
| | . | | | | | | | | |
| | 63 | 0 | 0 | 0 | 0 | 0 | 0 | 0 | 0 |
| | | 3 | 11 | 17 | 24 | 1 | 1 | 1 | 1 |

Bitwise OR circuit 210 may bitwise OR the rows of the value matrix and valid matrix to construct the following 4-entry list, with 4 valid entries:

{3,11,17,24}   (9)

Figure 3:
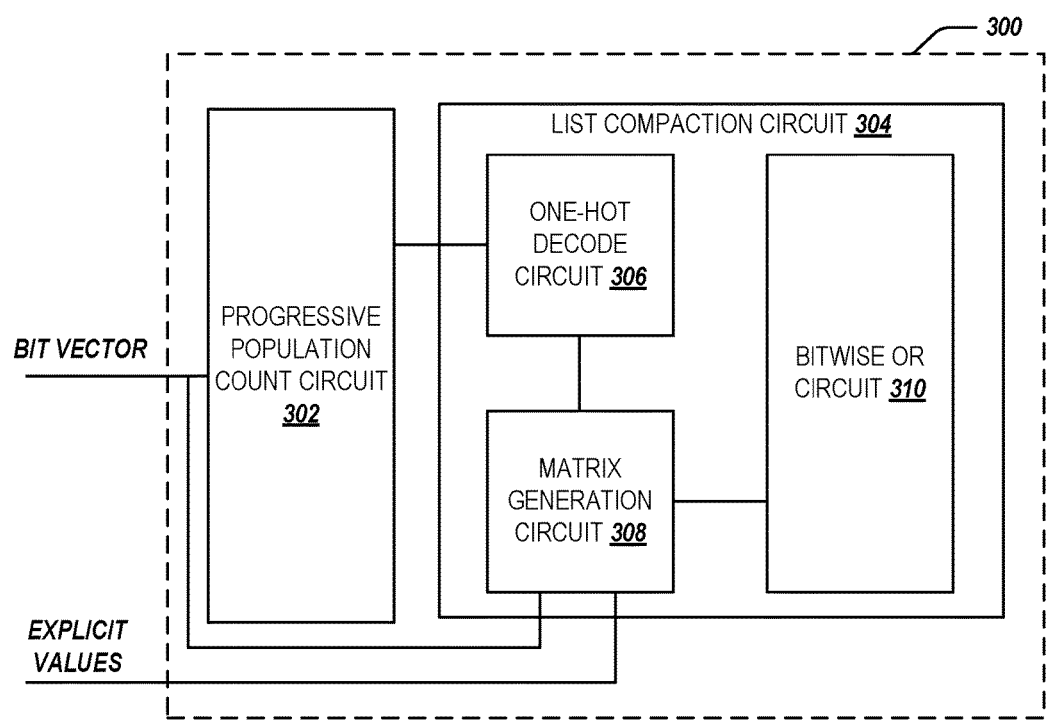
FIG. 3 is a block diagram of an example list manipulation circuit.

FIG. 3 is a block diagram of an example list manipulation circuit 300. List manipulation circuit 300 may be used to compact lists of explicit values. In an example implementation of ECC codeword decoding, the list of explicit values may be a list of error locations in an ECC codeword. The list of locations may include locations that are known to produce unreliable data (e.g., due to a memory device failure). These locations may be marked as invalid. List manipulation circuit 300 may compact the list by packing the list of valid values at the low end so that the invalid values may be excluded when the error information is stored in software-accessible registers.

As shown in FIG. 3, list manipulation circuit 300 may include various circuits and circuit components, such as a progressive population count circuit 302 and a list compaction circuit 304. List conversion circuit 104 may include a one-hot decode circuit 306, a matrix generation circuit 308, and a bitwise OR circuit 310. Other arrangements and numbers of components may be utilized without departing from the examples of the present disclosure. List manipulation circuit 300 may be implemented in an electronic hardware device such as, for example, an ASIC device, a SoC, or a FPGA. Progressive population count circuit 302, list compactor circuit 304, one-hot decode circuit 306, matrix generation circuit 308, and bitwise OR circuit 310 may be electronic and/or digital logic circuits implemented by the hardware device and may be defined in a HDL such as VHDL or Verilog.

Progressive population count circuit 302 may receive a bit vector made up of a string of 1 values and 0 values and a corresponding list of explicit values. The bit vector may indicate which explicit values in the list are valid. Each entry in the bit vector may correspond to an explicit value in the list. For example, the $0^{th}$ entry in the bit vector may correspond to the $0^{th}$ explicit value in the list, the $1^{th}$ entry in the bit vector may correspond to the $1^{st}$ explicit value in the list, and so on. A bit vector entry with a 1 value may indicate that the explicit value in the list corresponding to the entry is valid whereas bit vector entry with a 0 value may indicate that the explicit value in the list corresponding to the entry is invalid, or vice-versa . . . .

Progressive population count circuit 302 may generate a plurality of population count values for the received bit vector. Each one of the generated population count values may correspond to an entry (i.e., to one bit) in a bit vector. The population count value for the bit vector entry may be the total count of entries set to a 1 value in the bit vector prior to the entry. The population count values may be represented as k-bit binary values.

Progressive population circuit 302 may provide the population count values to one-hot decode circuit 306 of list compaction circuit 304. One-hot decode circuit 306 may produce a one-hot representation for each received population count value. One-hot decode circuit 306 may produce one-hot representations by converting the k-bit binary values to j-bit vectors. The one-hot representations may have one bit with a value of 1 in a position corresponding to the population count value and remaining bits in the one-hot representation may be a value of 0.

One-hot decode circuit 306 may provide the one-hot representations to matrix generation circuit 306. Matrix generation circuit 306 may also receive the bit vector and corresponding list of explicit values. With the bit vector, list of explicit values, and one-hot representations, matrix generation circuit 308 may generate a value matrix. Each row of the value matrix may correspond to one of the entries in the bit vector. The total quantity of rows and columns in the value matrix may be equal to the quantity of entries in the bit vector.

For each row in the value matrix, matrix generation circuit 308 may determine whether the corresponding bit vector entry is a 1 value or 0 value. If the corresponding bit vector entry is determined to be a 0 value, matrix generation circuit 308 may set all of the column positions in the row to binary values of 0. If the corresponding bit vector entry is determined to be a 1 value, matrix generation circuit 108 may set one of the column positions in the row to a binary value representing the explicit value corresponding to the entry, and may set the remaining column positions in the row to binary values of 0. For example, if an entry in a bit vector is be set to a 1 value, and its corresponding explicit value from the list of explicit values is 23, matrix generation circuit 308 may set one of the column positions in the row corresponding to that entry to a binary value representing the number 23, and may set the remaining column positions in the row to binary values of 0.

The column position that is set to the explicit value corresponding to the bit vector entry may be determined based on the entry's corresponding one-hot representation. For example, the bit vector entry number of the entry may be placed in the column position equal to the location of the 1 value in the entry's corresponding one-hot representation. Accordingly, and as an example, if entry number 6 in a bit vector is set to a 1 value, and it has a one-hot representation of 0001000000000000 (i.e., a population count value of 3), matrix generation circuit 308 may set the fourth column position on the left side of the value matrix (i.e., column position 3) in the row corresponding to entry number 6 to a binary value representing its corresponding explicit value because the position 3 in the one-hot representation is set to a 1 value.

In some implementations, matrix generation circuit 308 may also generate a valid matrix from the bit vector and one-hot representations. Matrix generation circuit 308 may construct the valid matrix in similar fashion to the value matrix, except that a 1 value may be placed in a column position for entries that are set to a 1 value instead of their corresponding explicit values. The valid matrix may be used to construct a list of valid bits that indicate which explicit values in the resulting compacted list of explicit values are valid.

Bitwise OR circuit 310 may bitwise OR the rows of value matrix to generate the ordered list of explicit values. The bitwise OR operation may OR all of the values in a given column position for every row in the value matrix. Similarly, bitwise OR circuit 310 may bitwise OR the rows of valid matrix to generate a list of valid bits.

The following illustrates an example of an implementation of list manipulation circuit 300 compacting a list of explicit error locations in an ECC codeword:

$$\{2,6,18,19,29,39,43,50,52,55,60,63,67,78,--,--\} \quad (10)$$

At a certain point it may be found that some of the symbol locations in the ECC codeword are producing unreliable data:

$$\{16\text{-}23,55\} \quad (11)$$

Producing a modified list of identified error locations:

$$\{2,6,--,--,29,39,43,50,52,--,60,63,67,78,--,--\} \quad (12)$$

To prepare the list for consumption by software, list manipulation circuit 300 may compact the modified list such that the 11 valid values are packed on the low end. Each entry of the list has a corresponding valid indicator:

$$\{1,1,0,0,1,1,1,1,1,0,1,1,1,1,0,0\} \quad (13)$$

Progressive population count circuit 302 may perform a progressive population count on the valid bit vector. The output from the progressive population count may be a vector of 16 (4-bit) population count values. Each population count value may correspond to an entry of the bit vector and gives the count of 1 values in the bit vector up to (but not including) that entry:

Prog. pop. count={

$$0,1,2,2,2,3,4,5,6,7,7,8,9,10,11,11\}//\text{<-bit\_vec}[0\ldots15] \quad (14)$$

One-hot decode circuit 306 may generate one-hot representations for each of the population count values.

Next, matrix generation circuit 308 may construct a value matrix and a valid matrix from the bit vector and one-hot representations. Matrix generation circuit 308 finds a 1 value in bit vector entry 0. The corresponding one-hot representation has a 1 value in the 0 position, so matrix generation circuit 308 places a 2 from the original list of error locations into column position 0 of row 0 of the value matrix and 1 value into column position 0 of row 0 of the valid matrix. Matrix generation circuit 308 finds a 1 value in bit vector entry 1. The corresponding one-hot representation has a 1 value in position 1, so matrix generation circuit 108 places a 6 from the original list of error locations into column position 1 of row 1 of the value matrix and a 1 value in column position 1 of row 1 of the valid matrix. Matrix generation circuit 308 continues similarly with the remaining entries in the bit vector until the value matrix and valid matrix are complete:

(15)

|  |  | column |  |  |  |  |  |  |  |  |  |  |  |  |  |  | column |  |  |  |  |  |  |  |  |  |  |  |  |  |  |  |
|---|---|---|---|---|---|---|---|---|---|---|---|---|---|---|---|---|---|---|---|---|---|---|---|---|---|---|---|---|---|---|---|---|
|  |  | 0 | 1 | 2 | 3 | 4 | 5 | 6 | 7 | 8 | 9 | 10 | 11 | 12 | 13 | 14 | 15 | 0 | 1 | 2 | 3 | 4 | 5 | 6 | 7 | 8 | 9 | 10 | 11 | 12 | 13 | 14 | 15 |
| row | 0 | 2 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |
|  | 1 | 0 | 6 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |
|  | 2 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 |
|  | 3 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|  | 4 | 0 | 0 | 29 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 |
|  | 5 | 0 | 0 | 0 | 39 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 |
|  | 6 | 0 | 6 | 0 | 0 | 43 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 |
|  | 7 | 0 | 0 | 0 | 0 | 0 | 50 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 |
|  | 8 | 0 | 0 | 0 | 0 | 0 | 0 | 52 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 |
|  | 9 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|  | 10 | 0 | 0 | 0 | 0 | 0 | 0 | 0 | 60 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
|  | 11 | 0 | 0 | 0 | 0 | 0 | 0 | 0 | 0 | 63 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 |
|  | 12 | 0 | 0 | 0 | 0 | 0 | 0 | 0 | 0 | 0 | 67 | 0 | 0 | 0 | 0 | 0 | 0 | 0 | 0 | 0 | 0 | 0 | 0 | 0 | 0 | 0 | 1 | 0 | 0 | 0 | 0 | 0 | 0 |
|  | 13 | 0 | 0 | 0 | 0 | 0 | 0 | 0 | 0 | 0 | 0 | 78 | 0 | 0 | 0 | 0 | 0 | 0 | 0 | 0 | 0 | 0 | 0 | 0 | 0 | 0 | 0 | 1 | 0 | 0 | 0 | 0 | 0 |
|  | 14 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 |
|  | 15 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|  |  | 2 | 6 | 29 | 39 | 43 | 50 | 52 | 60 | 63 | 67 | 78 | 0 | 0 | 0 | 0 | 0 | 1 | 1 | 1 | 1 | 1 | 1 | 1 | 1 | 1 | 1 | 1 | 0 | 0 | 0 | 0 | 0 |

Bitwise OR circuit 310 may bitwise OR the rows of the value matrix and valid matrix to construct the following 16-entry list having 11 valid entries:

$$\{2,6,29,39,43,50,52,60,63,67,78,--,--,--,--,--\} \quad (16)$$

Figure 4:
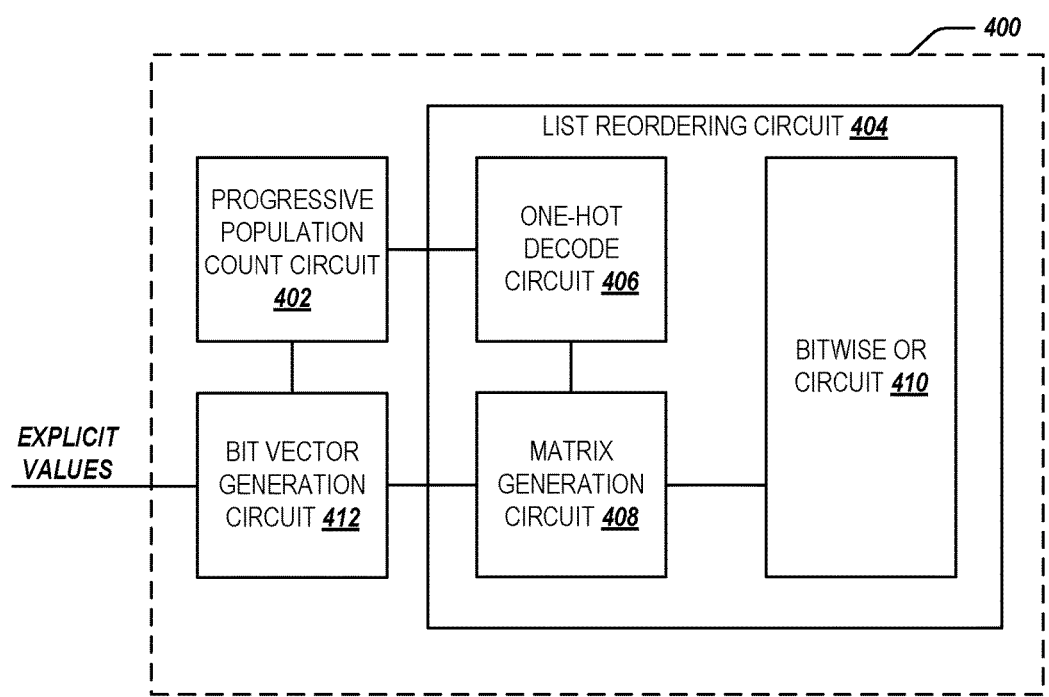
FIG. 4 is a block diagram of an example list manipulation circuit.

FIG. 4 is a block diagram of an example list manipulation circuit 400. List manipulation circuit 400 may be used to reorder lists of unique explicit values. As shown in FIG. 4, list manipulation circuit 400 may include various circuits and circuit components, such as a progressive population count circuit 402, a list reordering circuit 404, and a bit vector generation circuit 412. List reordering circuit 404 may include a one-hot decode circuit 406, a matrix generation circuit 408, and a bitwise OR circuit 410. Other arrangements and numbers of components may be utilized without departing from the examples of the present disclosure. List manipulation circuit 400 may be implemented in an electronic hardware device such as, for example, an ASIC device, a SoC, or a FPGA. Progressive population count circuit 402, list compactor circuit 404, one-hot decode circuit 404, matrix generation circuit 408, bitwise OR circuit 410, and bit vector generation circuit 412 may be electronic and/or digital logic circuits implemented by the hardware device and may be defined in a HDL such as VHDL or Verilog.

As shown in FIG. 4, list manipulation circuit 400 may receive a list of unique explicit values. Bit vector generation circuit 412 may generate a bit vector made up of a string of 1 values and 0 values from the received list of explicit values. Progressive population count circuit 402 may receive the bit vector and may generate a plurality of population count values for the received bit vector. Each one of the generated population count values may correspond to an entry (i.e., to one bit) in a bit vector. The population count value for the bit vector entry may be the total count of entries set to a 1 value in the bit vector prior to the entry. The population count values may be represented as k-bit binary values. Progressive population circuit 402 may provide the population count values to one-hot decode circuit 406 of list reordering circuit 404.

One-hot decode circuit 404 may produce a one-hot representation for each received population count value. One-hot decode circuit 406 may produce one-hot representations by converting the k-bit binary values to j-bit vectors. The one-hot representations may have one bit with a value of 1 in a position corresponding to the population count value and remaining bits in the one-hot representation may be a value of 0. One-hot decode circuit 406 may provide the one-hot representations to matrix generation circuit 408.

Matrix generation circuit 408 may also receive the bit vector. With the bit vector and one-hot representations, matrix generation circuit 408 may generate a value matrix. Each row of the value matrix may correspond to one of the entries in the bit vector. The total quantity of rows and columns in the value matrix may be equal to the quantity of entries in the bit vector.

For each row in the value matrix, matrix generation circuit 408 may determine whether the corresponding bit vector entry is a 1 value or 0 value. If the corresponding bit vector entry is determined to be a 0 value, matrix generation circuit 408 may set all of the column positions in the row to binary values of 0. If the corresponding bit vector entry is determined to be a 1 value, matrix generation circuit 408 may set one of the column positions in the row to a binary value representing the bit vector entry number of the entry, and may set the remaining column positions in the row to binary values of 0. For example, if the 8th bit vector entry in a bit vector is set to a 1 value, matrix generation circuit 408 may set one of the column positions in the row corresponding to that entry to a binary value representing the number 8, and may set the remaining column positions in the row to binary values of 0.

The column position that is set to the bit vector entry number of the entry may be determined based on the entry's corresponding one-hot representation. For example, the bit vector entry number of the entry may be placed in the column position equal to the location of the 1 value in the entry's corresponding one-hot representation. Accordingly, and as an example, if entry number 13 in a bit vector is set to a 1 value, and it has a one-hot representation of 0000000010000000 (i.e., a population count value of 8), matrix generation circuit 408 may set the eighth column position on the left side of the value matrix (i.e., column position 7) in the row corresponding to entry number 13 to a binary value representing the number 13 because the position 8 in the one-hot representation is set to a 1 value.

Bitwise OR circuit 410 may bitwise OR the rows of value matrices to generate ordered lists of bit vector entry numbers. The bitwise OR operation may OR all of the values in a given column position for every row in the value matrix.

Figure 5:
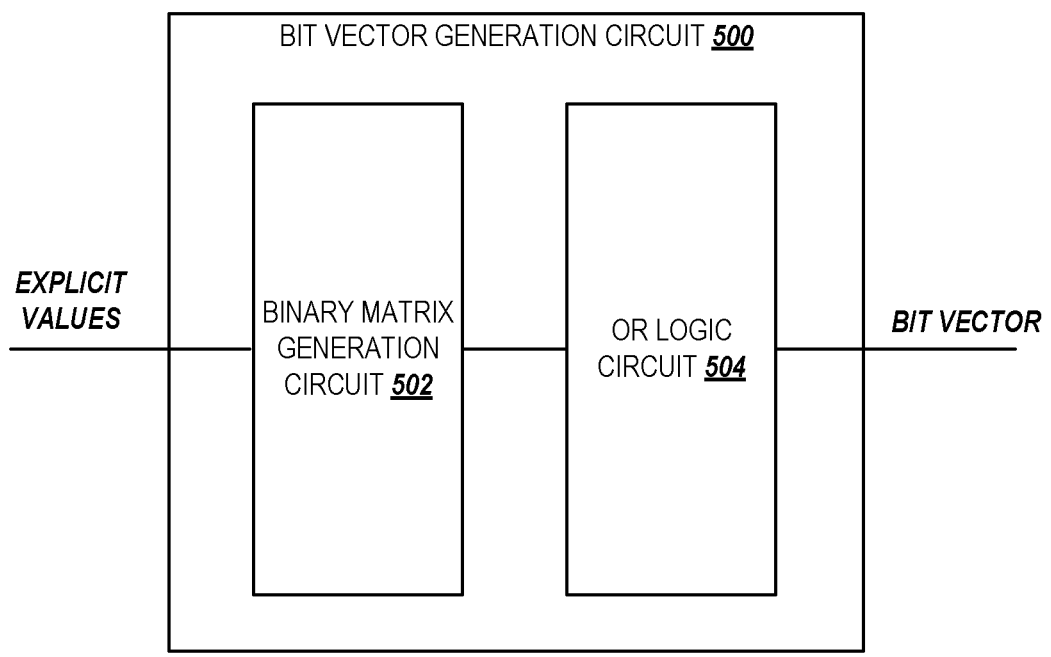
FIG. 5 is a block diagram of an example bit vector generation circuit.

FIG. 5 is a block diagram of an example bit vector generation circuit 500. Bit vector generation circuit 500 may be used to implement bit vector generation circuit 412 of FIG. 4. Bit vector generation circuit 500 may include a binary matrix generation circuit 502 and an OR logic circuit 504. These circuits may be implemented in hardware similar to list manipulation circuit 400 of FIG. 4, generally. Other arrangements and numbers of components may be utilized without departing from the examples of the present disclosure.

As shown in FIG. 5, binary matrix generation circuit 502 may receive a list of explicit values. The list of explicit values may be a list of unique explicit values in a range of possible values 0-t. Binary matrix generation circuit 502 may construct a binary matrix from the list of unique explicit values. The rows of the binary matrix may correspond to all the possible explicit binary values in the list of unique explicit values. For example, if each unique explicit value may be a value in a range of possible values 0-63, each row of the binary matrix may correspond to one of the possible values 0-63. The columns of the binary matrix may correspond to the positions of the unique explicit value in the list. For example, if the list includes 16 unique explicit values, numbered 0-15, each column of the binary matrix may correspond to one of the 0-15 positions in the list.

For each unique explicit binary value in the list, binary matrix generation circuit 502 may place a 1 value at an intersection of the row corresponding to the unique explicit value (i.e., the value of the unique explicit value) and the column corresponding to the position of unique explicit in the list. Binary matrix generation circuit 502 may set the remaining row/column intersections in the binary matrix to 0 values.

Once the binary matrix has been generated, OR logic circuit 504 may bitwise OR the columns of the binary matrix into the bit vector. OR logic circuit 504 may start with the column values in row 0. The OR of the values in row 0 may be placed at the right-most position of the bit vector. OR logic circuit 504 may continue with OR-ing the values in row 1 though row t, placing the results from right to left in the bit vector.

The following illustrates an example of an implementation of list manipulation circuit 400 of FIG. 4 reordering a list of 16 unique explicit values in a range of possible explicit values 0-63. In the following example illustration, bit vector generation circuit 412 may be implemented by bit vector generation circuit 500 of FIG. 5. List manipulation circuit 400 may reorder the following list of 16 unique explicit values from least to greatest:

$$\{44,29,0,25,62,7,11,30,59,45,6,60,51,18,47,32\} \quad (17)$$

Binary matrix generation circuit 502 of bit vector generation circuit 500 may generate a binary matrix from the list of unique explicit values. Each row of the binary matrix may correspond to one of the possible explicit values 0-63 and each column may correspond to one of the positions in the list 0-15. For each explicit value in the list, binary matrix generation circuit 502 may put a 1 value at the intersection of the row corresponding to its value and the column position corresponding to its position in the list. Thus, a 1 value may be set at the intersection of row 44 and column 0 for explicit value 44, a 1 value may be set at the intersection of row 29 and column 1 for explicit value 29, and so on to form the following binary matrix:

(18)

| | | col | | | | | | | | | | | | | | | |
|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 |
| row | 0 | 0 | 0 | 1 | 0 | 0 | 0 | 0 | 0 | 0 | 0 | 0 | 0 | 0 | 0 | 0 | 0 |
| | | | | | | | | ... | | | | | | | | | |
| | 6 | 0 | 0 | 0 | 0 | 0 | 0 | 0 | 0 | 0 | 0 | 1 | 0 | 0 | 0 | 0 | 0 |
| | 7 | 0 | 0 | 0 | 0 | 0 | 1 | 0 | 0 | 0 | 0 | 0 | 0 | 0 | 0 | 0 | 0 |
| | | | | | | | | ... | | | | | | | | | |
| | 11 | 0 | 0 | 0 | 0 | 0 | 0 | 1 | 0 | 0 | 0 | 0 | 0 | 0 | 0 | 0 | 0 |
| | | | | | | | | ... | | | | | | | | | |
| | 18 | 0 | 0 | 0 | 0 | 0 | 0 | 0 | 0 | 0 | 0 | 0 | 0 | 0 | 1 | 0 | 0 |
| | | | | | | | | ... | | | | | | | | | |
| | 25 | 0 | 0 | 0 | 1 | 0 | 0 | 0 | 0 | 0 | 0 | 0 | 0 | 0 | 0 | 0 | 0 |
| | | | | | | | | ... | | | | | | | | | |
| | 29 | 0 | 1 | 0 | 0 | 0 | 0 | 0 | 0 | 0 | 0 | 0 | 0 | 0 | 0 | 0 | 0 |
| | 30 | 0 | 0 | 0 | 0 | 0 | 0 | 0 | 1 | 0 | 0 | 0 | 0 | 0 | 0 | 0 | 0 |
| | | | | | | | | ... | | | | | | | | | |
| | 32 | 0 | 0 | 0 | 0 | 0 | 0 | 0 | 0 | 0 | 0 | 0 | 0 | 0 | 0 | 0 | 1 |
| | | | | | | | | ... | | | | | | | | | |
| | 44 | 1 | 0 | 0 | 0 | 0 | 0 | 0 | 0 | 0 | 0 | 0 | 0 | 0 | 0 | 0 | 0 |
| | 45 | 0 | 0 | 0 | 0 | 0 | 0 | 0 | 0 | 0 | 1 | 0 | 0 | 0 | 0 | 0 | 0 |
| | | | | | | | | ... | | | | | | | | | |
| | 47 | 0 | 0 | 0 | 0 | 0 | 0 | 0 | 0 | 0 | 0 | 0 | 0 | 0 | 0 | 1 | 0 |
| | | | | | | | | ... | | | | | | | | | |
| | 51 | 0 | 0 | 0 | 0 | 0 | 0 | 0 | 0 | 0 | 0 | 0 | 1 | 0 | 0 | 0 | 0 |
| | | | | | | | | ... | | | | | | | | | |
| | 59 | 0 | 0 | 0 | 0 | 0 | 0 | 0 | 0 | 1 | 0 | 0 | 0 | 0 | 0 | 0 | 0 |
| | 60 | 0 | 0 | 0 | 0 | 0 | 0 | 0 | 0 | 0 | 0 | 0 | 1 | 0 | 0 | 0 | 0 |
| | | | | | | | | ... | | | | | | | | | |
| | 62 | 0 | 0 | 0 | 0 | 1 | 0 | 0 | 0 | 0 | 0 | 0 | 0 | 0 | 0 | 0 | 0 |
| | | | | | | | | ... | | | | | | | | | |

OR logic circuit 504 may bitwise OR the columns of the binary matrix to form a bit vector. The bitwise OR of row 0 may be placed in the right-most position of the bit vector, the bitwise OR of row 1 may be placed in the second position from the right of the bit vector, and so on. The resulting 64-bit vector is as follows:

bit_vec[63:0]=col0|col1| . . . |col15=

0101100000001000_1011000000000001_

0110001000000100_0000100011000001   (19)

To convert the bit vector to a reordered list of the original 16 unique explicit values, progressive population count circuit 402 may perform a progressive population count on the bit vector. The output from the progressive population count may be a vector of 64 (4-bit) population count values. Each population count value may correspond to an entry of the bit vector and gives the count of 1 values in the bit vector up to (but not including) that entry:

Prog. pop. count={

0,1,1,1,1,1,1,2,3,3,3,3,4,4,4,4,11//<-bit_vec[0 . . . 15]

4,4,4,5,5,5,5,5,5,6,6,6,6,7,8,//<-bit_vec[16 . . . 31]

8,9,9,9,9,9,9,9,9,9,9,9,9,9,10,11,11,//<-bit_vec[32 . . . 47]

12,12,12,12,13,13,13,13,13,13,13,13,14,15,15,0}//<-bit_vec[48 . . . 63]   (20)

One-hot decode circuit 406 may generate one-hot representations for each population count values.

Next, matrix generation circuit 408 may construct a value matrix from the bit vector and one-hot representations. Matrix generation circuit 408 finds a 1 value in bit vector entry 0. The corresponding one-hot representation has a 1 value in the 0 position, so matrix generation circuit 408 places a 0 in column position 0 of row 0 of the value matrix. Matrix generation circuit 408 finds a 1 value in bit vector entry 6. The corresponding one-hot representation has a 1 value in position 1, so matrix generation circuit 408 places a 6 in column position 1 of row 6 of the value matrix. Matrix generation circuit 408 continues similarly with the remaining entries in the bit vector until the value matrix is complete:

(21)

| | | column | | | | | | | | | | | | | | | |
|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 |
| row | 0 | 0 | 0 | 0 | 0 | 0 | 0 | 0 | 0 | 0 | 0 | 0 | 0 | 0 | 0 | 0 | 0 |
| | | | | | | | | ... | | | | | | | | | |
| | 6 | 0 | 6 | 0 | 0 | 0 | 0 | 0 | 0 | 0 | 0 | 0 | 0 | 0 | 0 | 0 | 0 |
| | 7 | 0 | 0 | 7 | 0 | 0 | 0 | 0 | 0 | 0 | 0 | 0 | 0 | 0 | 0 | 0 | 0 |
| | | | | | | | | ... | | | | | | | | | |
| | 11 | 0 | 0 | 0 | 11 | 0 | 0 | 0 | 0 | 0 | 0 | 0 | 0 | 0 | 0 | 0 | 0 |
| | | | | | | | | ... | | | | | | | | | |
| | 18 | 0 | 0 | 0 | 0 | 18 | 0 | 0 | 0 | 0 | 0 | 0 | 0 | 0 | 0 | 0 | 0 |
| | | | | | | | | ... | | | | | | | | | |

(21)

| | column | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 25 | 0 | 0 | 0 | 0 | 0 | 25 | 0 | 0 | 0 | 0 | 0 | 0 | 0 | 0 | 0 | 0 |
| . . . | | | | | | | | | | | | | | | | |
| 29 | 0 | 0 | 0 | 0 | 0 | 0 | 29 | 0 | 0 | 0 | 0 | 0 | 0 | 0 | 0 | 0 |
| 30 | 0 | 0 | 0 | 0 | 0 | 0 | 0 | 30 | 0 | 0 | 0 | 0 | 0 | 0 | 0 | 0 |
| . . . | | | | | | | | | | | | | | | | |
| 32 | 0 | 0 | 0 | 0 | 0 | 0 | 0 | 0 | 32 | 0 | 0 | 0 | 0 | 0 | 0 | 0 |
| . . . | | | | | | | | | | | | | | | | |
| 44 | 0 | 0 | 0 | 0 | 0 | 0 | 0 | 0 | 0 | 44 | 0 | 0 | 0 | 0 | 0 | 0 |
| . . . | | | | | | | | | | | | | | | | |
| 45 | 0 | 0 | 0 | 0 | 0 | 0 | 0 | 0 | 0 | 0 | 45 | 0 | 0 | 0 | 0 | 0 |
| . . . | | | | | | | | | | | | | | | | |
| 47 | 0 | 0 | 0 | 0 | 0 | 0 | 0 | 0 | 0 | 0 | 0 | 47 | 0 | 0 | 0 | 0 |
| . . . | | | | | | | | | | | | | | | | |
| 51 | 0 | 0 | 0 | 0 | 0 | 0 | 0 | 0 | 0 | 0 | 0 | 0 | 51 | 0 | 0 | 0 |
| . . . | | | | | | | | | | | | | | | | |
| 59 | 0 | 0 | 0 | 0 | 0 | 0 | 0 | 0 | 0 | 0 | 0 | 0 | 0 | 59 | 0 | 0 |
| . . . | | | | | | | | | | | | | | | | |
| 60 | 0 | 0 | 0 | 0 | 0 | 0 | 0 | 0 | 0 | 0 | 0 | 0 | 0 | 0 | 60 | 0 |
| . . . | | | | | | | | | | | | | | | | |
| 62 | 0 | 0 | 0 | 0 | 0 | 0 | 0 | 0 | 0 | 0 | 0 | 0 | 0 | 0 | 0 | 62 |
| . . . | | | | | | | | | | | | | | | | |

Bitwise OR circuit 410 may bitwise OR the rows of the value matrix to construct the following reordered list of the original 16 unique explicit values:

$$\{0,6,7,11,18,25,29,30,32,44,45,47,51,59,60,62\} \quad (22)$$

Figure 6:
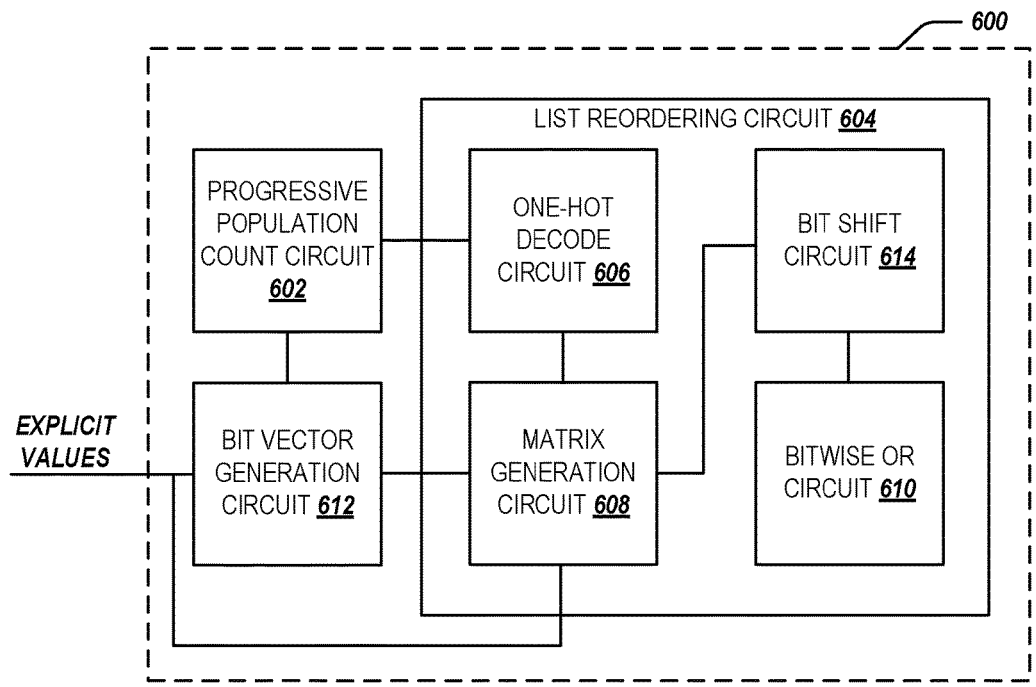
FIG. 6 is a block diagram of an example list manipulation circuit.

FIG. 6 is a block diagram of an example list manipulation circuit 600. List manipulation circuit 600 may be used to reorder lists of explicit values that may include non-unique values (i.e., duplicate values). As shown in FIG. 6, list manipulation circuit 600 may include various circuits and circuit components similar to those included in list manipulation circuit 400 of FIG. 4, such as a progressive population count circuit 602, a bit vector generation circuit 612, and a list reordering circuit 604 including a one-hot decode circuit 606, a matrix generation circuit 608, and a bitwise OR circuit 610. List manipulation circuit 600 may also include a bit shift circuit 614. Other arrangements and numbers of components may be utilized without departing from the examples of the present disclosure. List manipulation circuit 600 may be implemented in an electronic hardware device and electronic and/or digital logic circuits similar to those used to implement list manipulation circuit 400 of FIG. 4.

As shown in FIG. 6, list manipulation circuit 600 may receive a list of explicit values. Bit vector generation circuit 612 may generate a bit vector made up of a string of 1 values and 0 values from the received list of explicit values. Progressive population count circuit 602 may receive the bit vector and may generate a plurality of population count values for the received bit vector. Each one of the generated population count values may correspond to an entry (i.e., to one bit) in a bit vector. The population count value for the bit vector entry may be the total count of entries set to a 1 value in the bit vector prior to the entry. The population count values may be represented as k-bit binary values. Progressive population circuit 602 may provide the population count values to one-hot decode circuit 606 of list reordering circuit 604.

One-hot decode circuit 604 may produce a one-hot representation for each received population count value. One-hot decode circuit 606 may produce one-hot representations by converting the k-bit binary values to j-bit vectors. The one-hot representations may have one bit with a value of 1 in a position corresponding to the population count value and remaining bits in the one-hot representation may be a value of 0. One-hot decode circuit 606 may provide the one-hot representations to matrix generation circuit 608.

Matrix generation circuit 608 may also receive the bit vector and corresponding list of explicit values. With the bit vector, list of explicit values, and one-hot representations, matrix generation circuit 608 may generate a value matrix. Each row of the value matrix may correspond to one of the entries in the bit vector. The total quantity of rows and columns in the value matrix may be equal to the quantity of entries in the bit vector.

For each row in the value matrix, matrix generation circuit 608 may determine whether the corresponding bit vector entry is a 1 value or 0 value. If the corresponding bit vector entry is determined to be a 0 value, matrix generation circuit 608 may set all of the column positions in the row to binary values of 0. If the corresponding bit vector entry is determined to be a 1 value, matrix generation circuit 608 may set one of the column positions in the row to a binary value representing the bit vector entry number of the entry, and may set the remaining column positions in the row to binary values of 0. For example, if the 21st bit vector entry in a bit vector is set to a 1 value, matrix generation circuit 608 may set one of the column positions in the row corresponding to that entry to a binary value representing the number 21, and may set the remaining column positions in the row to binary values of 0.

The column position that is set to the bit vector entry number of the entry may be determined based on the entry's corresponding one-hot representation. For example, the bit vector entry number of the entry may be placed in the column position equal to the location of the 1 value in the entry's corresponding one-hot representation. Accordingly, and as an example, if entry number 52 in a bit vector is set to a 1 value, and it has a one-hot representation of 0000000010000000 (i.e., a population count value of 12), matrix generation circuit 608 may set the twelfth column position on the left side of the value matrix (i.e., column position 11) in the row corresponding to entry number 52 to a binary value representing the number 52 because the position 11 in the one-hot representation is set to a 1 value.

Bit shift circuit 614 may right-shift the bit vector entry numbers in the value matrix by a quantity of bits. The right-shift may effectively divide the bit vector entry numbers by the total quantity of columns in the value matrix (or, in other words, the total possible quantity of positions in the list of explicit values) and discarding any remainder from the division. The quantity of bits by which bit shift circuit 614 shifts the bit vector entry numbers may therefore be derived by the total quantity of columns in the value matrix. In some implementations, the quantity of bits may be $\log_2$ of the total quantity of columns in the value matrix. For example, the quantity of bits may be 4 for a value matrix with 16 columns (columns 0-15).

Once the bit vector entry numbers in the value matrix have been adjusted by bit shift circuit 614, bitwise OR circuit 610 may bitwise OR the rows of value matrices to generate ordered lists of bit vector entry numbers. The bitwise OR operation may OR all of the values in a given column position for every row in the value matrix.

Figure 7:
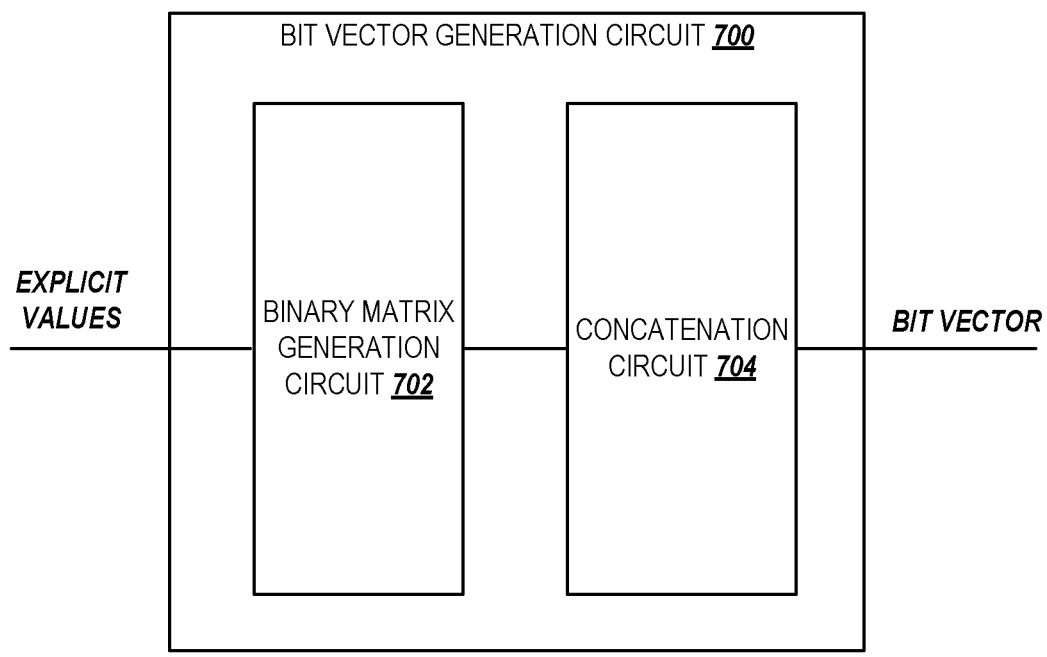
FIG. 7 is a block diagram of an example bit vector generation circuit.

FIG. 7 is a block diagram of an example bit vector generation circuit 700. Bit vector generation circuit 700 may be used to implement bit vector generation circuit 612 of FIG. 6. Bit vector generation circuit 700 may include a binary matrix generation circuit 702 and a concatenation circuit 704. These circuits may be implemented in hardware similar to list manipulation circuit 600 of FIG. 6, generally. Other arrangements and numbers of components may be utilized without departing from the examples of the present disclosure.

As shown in FIG. 7, binary matrix generation circuit 702 may receive a list of explicit values. The list of explicit values may be a list of explicit values in a range of possible values 0-t that may include duplicate values. Binary matrix generation circuit 702 may construct a binary matrix from the list of unique explicit values. The rows of the binary matrix may correspond to all the possible explicit values in the range 0-t. For example, if each explicit value in the list may be a value in a range of possible values 0-9, each row of the binary matrix may correspond to one of the possible values 0-9. The columns of the binary matrix may correspond to the positions of the explicit value in the list. For example, if the list includes up to 16 explicit values, numbered 0-15, each column of the binary matrix may correspond to one of the 0-15 positions in the list.

For each explicit value in the list, binary matrix generation circuit 702 may place a 1 value at an intersection of the row corresponding to the explicit value (i.e., the value of the unique explicit value) and the column corresponding to the position of explicit value in the list. Binary matrix generation circuit 702 may set the remaining row/column intersections in the binary matrix to 0 values.

Once the binary matrix has been generated, concatenation circuit 704 may concatenate the rows of the binary matrix into the bit vector. Concatenation circuit 704 may start by placing row 0 at the right most side of the bit vector and may place subsequent rows (i.e., rows 1-t) moving from right to left in the bit vector.

The following illustrates an example of an implementation of list manipulation circuit 600 of FIG. 6 reordering a list of 16 explicit values in a range of possible explicit values 0-9 where some of the values may be duplicates. In the following example illustration, bit vector generation circuit 612 may be implemented by bit vector generation circuit 700 of FIG. 7. List manipulation circuit 600 may reorder the following list of 16 explicit values from least to greatest:

$$\{3,1,6,7,0,2,5,8,0,4,9,3,2,1,1,7\} \quad (23)$$

Binary matrix generation circuit 702 of bit vector generation circuit 700 may generate a binary matrix from the list of explicit values. Each row of the binary matrix may correspond to one of the possible explicit values 0-9 and each column may correspond to one of the positions in the list 0-15. For each explicit value in the list, binary matrix generation circuit 702 may put a 1 value at the intersection of the row corresponding to its value and the column position corresponding to its position in the list. Thus, a 1 value may be set at the intersection of row 3 and column 0 for explicit value 3 in list position 0, a 1 value may be set at the intersection of row 1 and column 1 for explicit value 1 in list position 1, a 1 value may be set at the intersection of row 3 and column 11 for explicit value 3 in list position 11, and so on to form the following binary matrix:

(24)

|  | col | | | | | | | | | | | | | | | |
|---|---|---|---|---|---|---|---|---|---|---|---|---|---|---|---|---|
|  | 0 | 1 | 2 | 3 | 4 | 5 | 6 | 7 | 8 | 9 | 10 | 11 | 12 | 13 | 14 | 15 |
| row 0 | 0 | 0 | 0 | 0 | 1 | 0 | 0 | 0 | 1 | 0 | 0 | 0 | 0 | 0 | 0 | 0 |
| 1 | 0 | 1 | 0 | 0 | 0 | 0 | 0 | 0 | 0 | 0 | 0 | 0 | 0 | 1 | 1 | 0 |
| 2 | 0 | 0 | 0 | 0 | 0 | 1 | 0 | 0 | 0 | 0 | 0 | 0 | 1 | 0 | 0 | 0 |
| 3 | 1 | 0 | 0 | 0 | 0 | 0 | 0 | 0 | 0 | 0 | 0 | 1 | 0 | 0 | 0 | 0 |
| 4 | 0 | 0 | 0 | 0 | 0 | 0 | 0 | 0 | 0 | 1 | 0 | 0 | 0 | 0 | 0 | 0 |
| 5 | 0 | 0 | 0 | 0 | 0 | 0 | 1 | 0 | 0 | 0 | 0 | 0 | 0 | 0 | 0 | 0 |
| 6 | 0 | 0 | 1 | 0 | 0 | 0 | 0 | 0 | 0 | 0 | 0 | 0 | 0 | 0 | 0 | 0 |
| 7 | 0 | 0 | 0 | 1 | 0 | 0 | 0 | 0 | 0 | 0 | 0 | 0 | 0 | 0 | 0 | 1 |
| 8 | 0 | 0 | 0 | 0 | 0 | 0 | 0 | 1 | 0 | 0 | 0 | 0 | 0 | 0 | 0 | 0 |
| 9 | 0 | 0 | 0 | 0 | 0 | 0 | 0 | 0 | 0 | 0 | 1 | 0 | 0 | 0 | 0 | 0 |

Concatenation circuit 704 may concatenate the rows of the binary matrix to form a bit vector. The rows may be concatenated from row 0 to row 9 starting in the right-most position of the bit vector and moving to the left-most position of the bit vector:

bit_vec[159:0]={row9[15:0],row8[15:0],row0[15:0]
}=

0000010000000000_0000000010000000

1000000000001000_0000000000000100

0000000001000000_0000001000000000

0000100000000001_0001000000100000

0110000000000010_0000000100010000 (25)

To convert the 160-bit vector to a reordered list of the original 16 explicit values, progressive population count circuit 602 may perform a progressive population count on the bit vector. The output from the progressive population count may be a vector of 160 (4-bit) population count values. Each population count value may correspond to an entry of the bit vector and gives the count of 1 values in the bit vector up to (but not including) that entry:

Prog. pop. count={

0,0,0,0,0,1,1,1,1,2,2,2,2,2,2,2,//<-bit_vec[0 . . . 15]

2,2,3,3,3,3,3,3,3,3,3,3,3,3,4,5,//<-bit_vec[16 . . . 31]

5,5,5,5,5,5,6,6,6,6,6,6,6,7,7,7,//<-bit_vec[32 . . . 47]

7,8,8,8,8,8,8,8,8,8,8,9,9,9,9,//<-bit_vec[48 . . . 63]

9,9,9,9,9,9,9,9,9,10,10,10,10,10,10,10,//<-bit_vec[64 . . . 79]

10,10,10,10,10,10,10,11,11,11,11,11,11,11,11,11,//<-bit_vec[80 . . . 95]

11,11,11,12,12,12,12,12,12,12,12,12,12,12,12,12,//<-bit_vec[96 . . . 111]

12,12,12,12,13,13,13,13,13,13,13,13,13,13,13,13,//<-bit_vec[112 . . . 127]

14,14,14,14,14,14,14,14,15,15,15,15,15,15,15,15,//<-bit_vec[128 . . . 143]

15,15,15,15,15,15,15,15,15,15,15,15,0,0,0,0}//<-bit_vec[144 . . . 159]  (26)

One-hot decode circuit 606 may generate one-hot representations for each population count values.

Next, matrix generation circuit 608 may construct a value matrix from the bit vector and one-hot representations. Matrix generation circuit 608 finds a 1 value in bit vector entry 4. The corresponding one-hot representation has a 1 value in the 0 position, so matrix generation circuit 608 places a 0 in column position 0 of row 0 of the value matrix. Matrix generation circuit 408 finds a 1 value in bit vector entry 8. The corresponding one-hot representation has a 1 value in position 1, so matrix generation circuit 408 places an 8 in column position 1 of row 8 of the value matrix. Matrix generation circuit 608 continues similarly with the remaining entries in the bit vector until the value matrix is complete. Bit shift circuit 614 then shifts the values in the value matrix by 4 bits, essentially dividing the values by 16 and disregarding the remainder. The follow is the resulting value matrix:

(27)

| | | | | | | | | column | | | | | | | | | |
|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | |
| 4 | 0 | 0 | 0 | 0 | 0 | 0 | 0 | 0 | 0 | 0 | 0 | 0 | 0 | 0 | 0 | 0 | 0 = floor(1/16) |
| 8 | 0 | 0 | 0 | 0 | 0 | 0 | 0 | 0 | 0 | 0 | 0 | 0 | 0 | 0 | 0 | 0 | 0 = floor(8/16) |
| 17 | 0 | 0 | 1 | 0 | 0 | 0 | 0 | 0 | 0 | 0 | 0 | 0 | 0 | 0 | 0 | 1 | 1 = floor(17/16) |
| 29 | 0 | 0 | 0 | 1 | 0 | 0 | 0 | 0 | 0 | 0 | 0 | 0 | 0 | 0 | 0 | 1 | 1 = floor(29/16) |
| 30 | 0 | 0 | 0 | 0 | 1 | 0 | 0 | 0 | 0 | 0 | 0 | 0 | 0 | 0 | 0 | 1 | 1 = floor(30/16) |
| 37 | 0 | 0 | 0 | 0 | 0 | 2 | 0 | 0 | 0 | 0 | 0 | 0 | 0 | 0 | 0 | 2 | 2 = floor(37/16) |
| 44 | 0 | 0 | 0 | 0 | 0 | 0 | 2 | 0 | 0 | 0 | 0 | 0 | 0 | 0 | 0 | 2 | 2 = floor(44/16) |
| 48 | 0 | 0 | 0 | 0 | 0 | 0 | 0 | 3 | 0 | 0 | 0 | 0 | 0 | 0 | 0 | 3 | 3 = floor(48/16) |
| 59 | 0 | 0 | 0 | 0 | 0 | 0 | 0 | 0 | 3 | 0 | 0 | 0 | 0 | 0 | 0 | 3 | 3 = floor(59/16) |
| 73 | 0 | 0 | 0 | 0 | 0 | 0 | 0 | 0 | 0 | 4 | 0 | 0 | 0 | 0 | 0 | 4 | 4 = floor(73/16) |
| 86 | 0 | 0 | 0 | 0 | 0 | 0 | 0 | 0 | 0 | 0 | 5 | 0 | 0 | 0 | 0 | 5 | 5 = floor(86/16) |
| 98 | 0 | 0 | 0 | 0 | 0 | 0 | 0 | 0 | 0 | 0 | 0 | 6 | 0 | 0 | 0 | 6 | 6 = floor(98/16) |
| 115 | 0 | 0 | 0 | 0 | 0 | 0 | 0 | 0 | 0 | 0 | 0 | 0 | 7 | 0 | 0 | 7 | 7 = floor(115/16) |
| 127 | 0 | 0 | 0 | 0 | 0 | 0 | 0 | 0 | 0 | 0 | 0 | 0 | 7 | 0 | 0 | 7 | 7 = floor(127/16) |
| 135 | 0 | 0 | 0 | 0 | 0 | 0 | 0 | 0 | 0 | 0 | 0 | 0 | 0 | 8 | 0 | 8 | 8 = floor(135/16) |
| 154 | 0 | 0 | 0 | 0 | 0 | 0 | 0 | 0 | 0 | 0 | 0 | 0 | 0 | 0 | 9 | 9 | 9 = floor(154/16) |

Bitwise OR circuit 610 may bitwise OR the rows of the value matrix to construct the following reordered list of the original 16 explicit values:

{0,0,1,1,1,2,2,3,3,4,5,6,7,7,8,9}  (28)

Figure 8:
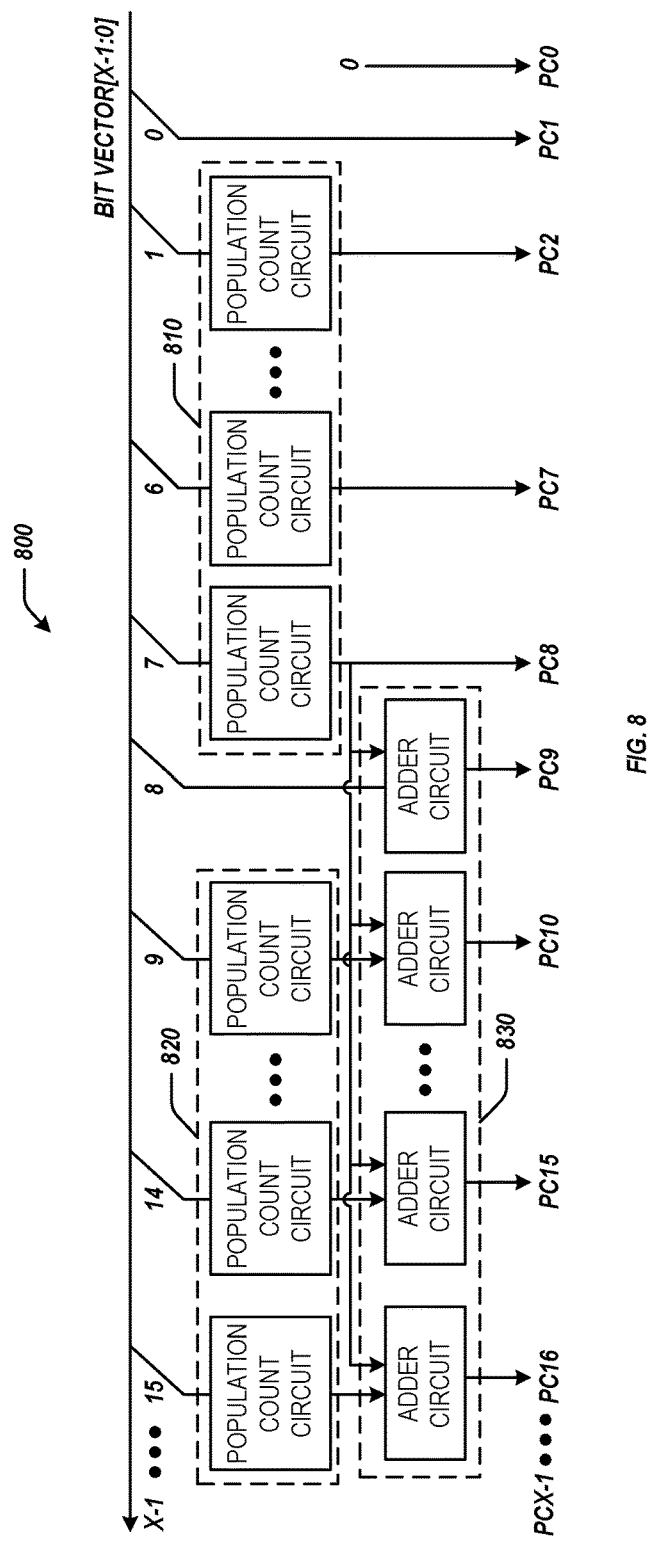
FIG. 8 is a block diagram of an example progressive population count circuit.

FIG. 8 is a block diagram of an example progressive population count circuit 800. Progressive population count circuit 800 may be used to implement progressive population count circuit 102 of FIG. 1, progressive population count circuit 302 of FIG. 3, progressive population count circuit 402 of FIG. 4, and progressive population count circuit 602 of FIG. 6. As shown in FIG. 8, progressive population count circuit 800 may include various circuits and circuit components, such as a plurality of population count circuits (e.g., population count circuits 810, population count circuits 820) and a plurality of adder circuits 830. Other arrangements and numbers of components may be utilized without departing from the examples of the present disclosure. Progressive population count circuit 800 may be implemented in an electronic hardware device such as, for example, an ASIC device, a SoC, or a FPGA. Population count circuits 810 and 820 and adder circuits 830 may be electronic and/or digital logic circuits implemented by the hardware device and may be defined in a HDL such as VHDL or Verilog.

Progressive population count circuit 800 may generate a plurality of population count values for a bit vector including x bits. Each one of the plurality of population count values, PC0-PCx−1, may correspond to an entry in the range of entries 0:x−1 in the bit vector. The population count value for each entry may be the sum of the quantity of entries set to a 1 value in the bit vector prior to the entry. As shown in the example illustrated in FIG. 8, PC0 for entry 0 in the bit vector may be 0 because there it is the first entry in the bit vector and therefor there is no count prior to the first entry. PC1 for entry 1 may be the count of 1 values in entry 0. Each of population count circuits 810 may generate a population count value for an assigned entry in a first range of entries in the bit vector, the population count value for each entry in the first range may include a count of a quantity of entries set to a 1 value in the first range of entries prior to the entry. Each of population count circuits 820 may generate a population count value for an assigned entry in a second range of entries in the bit vector, the population count value for each entry in the second range may include a count of a quantity of entries set to a 1 value in the second range of entries prior to the entry. Each of adder circuits 830 may add a population count value for a last entry in the first range of entries to the population count value for each entry in the second range of entries.

As an example of the above, population count circuits 810 may perform population counts for PC2-PC8. At PC2 for entry 2, one of population count circuits 810 may count the quantity of 1 values in entries 0 and 1. At PC2 for entry 2, one of population count circuits 810 may count the quantity of 1 values in entries 0 and 1. At PC3 for entry 3, one of population count circuits 810 may count the quantity of 1 values in entries 0-2. At PC4 for entry 4, one of population count circuits 810 may count the quantity of 1 values in entries 0-3, and so on to PC8 for entry 8.

At PC9 for entry 9, in order to minimize the complexity of the population count circuits in progressive population count circuit 800, instead of having a population count circuit that counts the 1 values from 0-8, the population count value PC8 for entry 8 (which is the count of 1 values from entries 0-7) generated by one of population count circuits 810 may be fed into one of adder circuits 830 along with the value at entry 8. Similarly for PC10-PC16 for entries 10-16, the population count value PC8 for entry 8 may be fed into one of adder circuits 830 along with the population counts for each of these population count values. For example, PC10 for entry 10 may be the quantity of 1 values in entries 8 and 9 executed by one of population count circuits 820 added to PC8 by one of adder circuits 830. PC11-PC16 may be computed similarly to PC10.

The structure of PC9-PC16 may be repeated for the remaining population count values of the bit vector. Progressive population count circuit 800 may be parameterized such that it may be used to compute population count values for bit vectors of any size. Moreover, adder circuits 830 may be parameterized such that the input width of adder circuits 830 is less than a maximum possible quantity of entries in the bit vector set to a 1 value.

Figure 9:
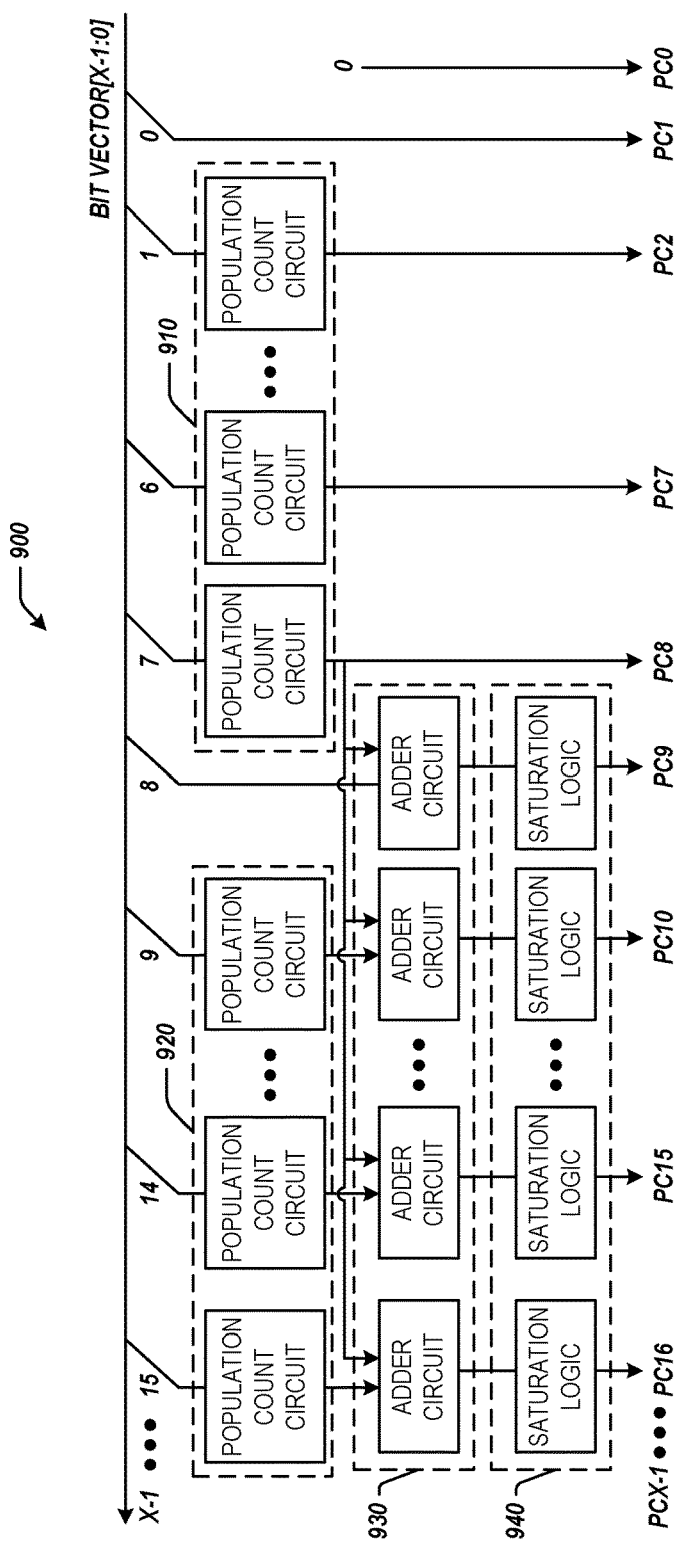
FIG. 9 is a block diagram of an example progressive population count circuit.

FIG. 9 is a block diagram of an example progressive population count circuit 900. Progressive population count circuit 900 may be used to implement progressive population count circuit 202 of FIG. 2. As shown in FIG. 9, progressive population count circuit 900 may include various circuits and circuit components, such as a plurality of population count circuits (e.g., population count circuits 910, population count circuits 920) a plurality of adder circuits 930, and a plurality of saturation logic circuits 940. Each of saturation logic circuits 940 may connected to an output of one of adder circuits 930. Other arrangements and numbers of components may be utilized without departing from the examples of the present disclosure.

Progressive population count circuit 900 may be implemented in an electronic hardware device such as, for example, an ASIC device, a SoC, or a FPGA. Population count circuits 910 and 920, adder circuits 930, and saturation logic circuits 940 may be electronic and/or digital logic circuits implemented by the hardware device and may be defined in a HDL such as VHDL or Verilog.

In operation, progressive population count circuit 900 may operate similarly to progressive population count circuit 800 of FIG. 8. However, saturation logic circuits 940 may set population count values equal to or greater than a threshold population count value to a saturation value.

The foregoing disclosure describes a number of example list manipulation circuit implementations. For purposes of explanation, certain examples are described with reference to the components illustrated in FIGS. 1-9. The functionality of the illustrated components may overlap, however, and may be present in a fewer or greater number of elements and components. Further, all or part of the functionality of illustrated elements may co-exist or be distributed among several geographically dispersed locations.

Further, the sequence of operations described in connection with the examples disclosed herein are examples and is not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

The invention claimed is:

1. A list manipulation circuit, comprising:
   a progressive population count circuit to generate a plurality of population count values, each one of the plurality of population count values corresponding to an entry in a bit vector; and
   a list conversion circuit, comprising:
   a one-hot decode circuit to, for each population count value, produce a one-hot representation having one bit with a value of 1 in a position corresponding to the population count value and remaining bits with a value of 0;
   a matrix generation circuit to generate a value matrix, each row of the value matrix corresponding to one entry in the bit vector, wherein, for each row of the value matrix, the matrix generation circuit is to set the row to all 0 values or to set one column position in the row to a bit vector entry number of the corresponding entry in the bit vector based on a value of the entry in the bit vector and its corresponding one-hot representation; and a bitwise OR circuit to bitwise OR the rows of the value matrix to generate an ordered list of bit vector entry numbers.

2. The list manipulation circuit of claim 1, wherein the progressive population count circuit comprises:
a first plurality of population count circuits, each of the first plurality of population count circuits to generate a population count value for an assigned entry in a first range of entries in the bit vector, the population count value for each entry in the first range comprising a count of a quantity of entries set to a 1 value in the first range of entries prior to the entry;
a second plurality of population count circuits, each of the second plurality of population count circuits to generate a population count value for an assigned entry in a second range of entries in the bit vector, the population count value for each entry in the second range comprising a count of a quantity of entries set to a 1 value in the second range of entries prior to the entry; and
a plurality of adder circuits, each of the plurality of adder circuits to add a population count value for a last entry in the first range of entries to the population count value for each entry in the second range of entries.

3. The list manipulation circuit of claim 2, wherein an input width of the plurality of adder circuits is less than a maximum possible quantity of entries in the bit vector set to a 1 value.

4. The list manipulation circuit of claim 2, wherein the progressive population count circuit comprises:
a plurality of saturation logic circuits, each of the plurality of saturation logic circuits being connected an output of one of the plurality of adder circuits, the plurality of saturation logic circuits to set population count values equal to or greater than a threshold population count value to a saturation value.

5. The list manipulation circuit of claim 4, wherein the matrix generation circuit is to:
set, as all 0 values, rows of the value matrix corresponding to entries in the bit vector having corresponding population count values equal to or greater than the saturation value.

6. The list manipulation circuit of claim 1, comprising:
a bit vector generation circuit to:
generate the bit vector from a list of explicit values; and
provide the bit vector to the progressive population circuit.

7. The list manipulation circuit of claim 6, wherein the bit vector generation circuit comprises:
a binary matrix generation circuit to generate a binary matrix from the list of explicit values; and
an OR logic circuit to bitwise OR rows of the binary matrix, the bit vector being the output of the OR operation.

8. The list manipulation circuit of claim 1, wherein the matrix generation circuit is to:
generate a valid matrix, each row of the valid matrix corresponding to one entry in the bit vector and including a 1 value in a column location or all 0 values based on a value of the entry in the bit vector and its corresponding one-hot representation.

9. The list manipulation circuit of claim 8, wherein the bitwise OR circuit is to:
bitwise OR the rows of the valid matrix to generate a list of valid bits indicating which bit vector entry numbers in the ordered list of bit vector entry numbers are valid.

10. The list manipulation circuit of claim 1, wherein:
the one column position in the row corresponds to a position of the 1 value in the one-hot representation corresponding to the entry in the bit vector.

11. The list manipulation circuit of claim 1, wherein:
the ordered list of bit vector entry numbers is ordered from lowest bit vector entry number to highest bit vector entry number.

12. A list manipulation circuit, comprising:
a progressive population count circuit to:
receive a bit vector comprising a plurality of entries, each entry in the bit vector being associated with an entry in a list of explicit values, and each entry in the bit vector indicating whether its associated entry in the list of explicit values is valid;
generate a plurality of population count values, each one of the plurality of population count values corresponding to one of the plurality of entries in the bit vector; and
a list compaction circuit, comprising:
a one-hot decode circuit to, for each population count value, produce a one-hot representation having one bit with a value of 1 in a position corresponding to the population count value and remaining bits with a value of 0;
a matrix generation circuit to generate a value matrix, each row of the value matrix corresponding to one entry in the bit vector, wherein, for each row of the value matrix, the matrix generation circuit is to:
in response determining that an explicit value associated with the entry in the bit vector corresponding to the row is invalid, set the row to all 0 values; and
in response to determining that the explicit value associated with the entry in the bit vector corresponding to the row is valid, set one column position in the row to the explicit value based on the one-hot representation corresponding to the entry in the bit vector; and
a bitwise OR circuit to bitwise OR the rows of the value matrix to generate a compacted list of explicit values.

13. The list manipulation circuit of claim 12, wherein:
the entries in the list of explicit values represent error locations in an error-correction code (ECC) codeword; and
each entry in the bit vector indicates whether its associated error location in the ECC codeword is known to produce unreliable data.

14. A list manipulation circuit, comprising:
a bit vector generation circuit to generate a bit vector from a list of explicit values;
a progressive population count circuit to generate a plurality of population count values, each one of the plurality of population count values corresponding to an entry in the bit vector; and
a list reordering circuit, comprising:
a one-hot decode circuit to, for each population count value, produce a one-hot representation having one bit with a value of 1 in a position corresponding to the population count value and remaining bits with a value of 0;

a matrix generation circuit to generate a value matrix, each row of the value matrix corresponding to one entry in the bit vector,
wherein, for each row of the value matrix, the matrix generation circuit is to set the row to all 0 values or to set one column position in the row to a bit vector entry number of the corresponding entry in the bit vector based on a value of the entry in the bit vector and its corresponding one-hot representation; and
a bitwise OR circuit to bitwise OR the rows of the value matrix to generate an ordered list of bit vector entry numbers.

15. The list manipulation circuit of claim 14, wherein:
the list of explicit values is a list of unique explicit values; and
the bit vector generation circuit comprises:
a binary matrix generation circuit to generate a binary matrix from the unique explicit values, rows of the binary matrix corresponding to possible explicit values and columns of the binary matrix corresponding to positions of the unique explicit values in the list of unique explicit values, wherein the binary matrix generation circuit is to:
for each unique explicit value in the list, place a 1 value at an intersection of a row corresponding to the unique explicit value and a column corresponding to a position of the unique explicit binary value in the list; and
an OR logic circuit to bitwise OR the columns of the binary matrix into the bit vector.

16. The list manipulation circuit of claim 14, wherein
the list of explicit values includes non-unique explicit values; and
the bit vector generation circuit comprises:
a binary matrix generation circuit to generate a binary matrix from the explicit values, rows of the binary matrix corresponding to possible explicit values and columns of the binary matrix corresponding to positions in the list of explicit values, wherein the binary matrix generation circuit is to:
for each explicit value in the list, place a 1 value at an intersection of a row corresponding to the explicit value and a column corresponding to a position of the explicit value in the list; and
a concatenation circuit to concatenate rows of the binary matrix to form the bit vector.

17. The list manipulation circuit of claim 16, wherein the list reordering circuit comprises:
a bit-shift circuit to divide bit vector entry numbers in the value matrix by right-shifting the bit vector entry numbers by a quantity of bits.

* * * * *